United States Patent
Ito

(10) Patent No.: US 9,978,848 B2
(45) Date of Patent: May 22, 2018

(54) UTBB FDSOI SPLIT GATE DEVICES

(71) Applicant: Avago Technologies General IP (Singapore) Pte. Ltd, Singapore (SG)

(72) Inventor: Akira Ito, Irvine, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days. days.

(21) Appl. No.: 14/928,603

(22) Filed: Oct. 30, 2015

(65) Prior Publication Data

US 2017/0018622 A1    Jan. 19, 2017

Related U.S. Application Data

(60) Provisional application No. 62/193,953, filed on Jul. 17, 2015.

(51) Int. Cl.
| | |
|---|---|
| *H01L 29/06* | (2006.01) |
| *H01L 29/51* | (2006.01) |
| *H01L 29/78* | (2006.01) |
| *H01L 29/423* | (2006.01) |

(52) U.S. Cl.
CPC .... *H01L 29/42368* (2013.01); *H01L 29/0649* (2013.01); *H01L 29/512* (2013.01); *H01L 29/7838* (2013.01)

(58) Field of Classification Search
CPC ........... H01L 29/42368; H01L 29/0649; H01L 29/512; H01L 29/7838
See application file for complete search history.

(56) References Cited

U.S. PATENT DOCUMENTS

| | | | | | |
|---|---|---|---|---|---|
| 4,295,265 | A | * | 10/1981 | Horiuchi | H01L 21/26 257/316 |
| 4,928,159 | A | * | 5/1990 | Mihara | H01L 21/76 257/327 |
| 5,017,979 | A | * | 5/1991 | Fujii | H01L 21/28273 257/319 |
| 5,414,658 | A | * | 5/1995 | Challa | G11C 16/0416 365/185.06 |
| 5,844,269 | A | * | 12/1998 | Kuo | H01L 29/42324 257/315 |
| 6,222,234 | B1 | * | 4/2001 | Imai | H01L 27/1203 257/347 |
| 6,441,431 | B1 | * | 8/2002 | Efland | H01L 29/086 257/335 |
| 6,660,598 | B2 | * | 12/2003 | Hanafi | H01L 29/66545 257/E21.415 |

(Continued)

*Primary Examiner* — Ida M Soward
(74) *Attorney, Agent, or Firm* — Sterne, Kessler, Goldstein & Fox P.L.L.C.

(57) ABSTRACT

An Ultra Thin Body and Box (UTBB) fully depleted silicon on insulator (FDSOI) field effect transistor (FET) employing a split gate topology is provided. A gate dielectric layer is disposed beneath a gate structure and in contact with a channel layer of the device. The gate dielectric layer contains two portions, a thin portion and a thick portion. The thin portion is arranged and configured to reduce a transconductance of the device, while a thick portion is arranged and configured to increase the break down voltage of the device. The device further contains a bulk region that can be electrically connected to voltage source to provide control over the threshold voltage of the device.

21 Claims, 3 Drawing Sheets

(56) References Cited

U.S. PATENT DOCUMENTS

| | | | |
|---|---|---|---|
| 6,774,000 B2 * | 8/2004 | Natzle | H01L 21/28035 257/E21.131 |
| 6,818,509 B2 * | 11/2004 | Park | H01L 27/11524 257/E21.69 |
| 6,914,297 B2 * | 7/2005 | Deboy | H01L 27/0248 257/341 |
| 7,598,128 B2 * | 10/2009 | Hsu | H01L 29/0657 438/140 |
| 7,602,017 B2 * | 10/2009 | Cai | H01L 21/823412 257/335 |
| 7,888,735 B2 * | 2/2011 | Cai | H01L 29/0847 257/343 |
| 8,361,863 B2 * | 1/2013 | Choi | H01L 27/1085 438/250 |
| 8,461,647 B2 * | 6/2013 | Chou | H01L 29/42368 257/335 |
| 9,129,687 B2 * | 9/2015 | Kurjanowicz | G11C 17/16 |
| 9,240,497 B2 * | 1/2016 | Ning | H01L 21/84 |
| 9,391,030 B1 * | 7/2016 | Li | H01L 23/573 |
| 2001/0021555 A1 * | 9/2001 | Bottini | H01L 27/11526 438/258 |
| 2004/0016958 A1 * | 1/2004 | Kato | H01L 21/28273 257/316 |
| 2005/0275038 A1 * | 12/2005 | Shih | H01L 29/78633 257/382 |
| 2007/0228463 A1 * | 10/2007 | Cai | H01L 21/823807 257/343 |
| 2008/0164537 A1 * | 7/2008 | Cai | H01L 29/0847 257/408 |
| 2009/0057762 A1 * | 3/2009 | Bangsaruntip | B82Y 10/00 257/347 |
| 2009/0230468 A1 * | 9/2009 | Cai | H01L 21/823412 257/337 |
| 2009/0283814 A1 * | 11/2009 | Chen | G11C 17/16 257/318 |
| 2010/0233862 A1 * | 9/2010 | Cai | H01L 29/10 438/237 |
| 2011/0042717 A1 * | 2/2011 | Cai | H01L 29/861 257/140 |
| 2011/0104861 A1 * | 5/2011 | Cai | H01L 29/0847 438/268 |
| 2011/0212579 A1 * | 9/2011 | Chen | H01L 21/76267 438/151 |
| 2012/0273883 A1 * | 11/2012 | Chen | H01L 29/42368 257/339 |
| 2013/0153929 A1 * | 6/2013 | Doris | H01L 21/28114 257/77 |
| 2013/0168755 A1 * | 7/2013 | Kim | G11C 16/0441 257/315 |
| 2014/0087531 A1 * | 3/2014 | Zuniga | H01L 21/823418 438/200 |
| 2014/0138777 A1 * | 5/2014 | Wang | G11C 17/16 257/379 |
| 2015/0179637 A1 * | 6/2015 | Pfirsch | H01L 27/0635 257/144 |
| 2016/0027773 A1 * | 1/2016 | Chen | H01L 27/088 257/337 |
| 2017/0018612 A1 * | 1/2017 | Ito | H01L 29/1095 |

* cited by examiner

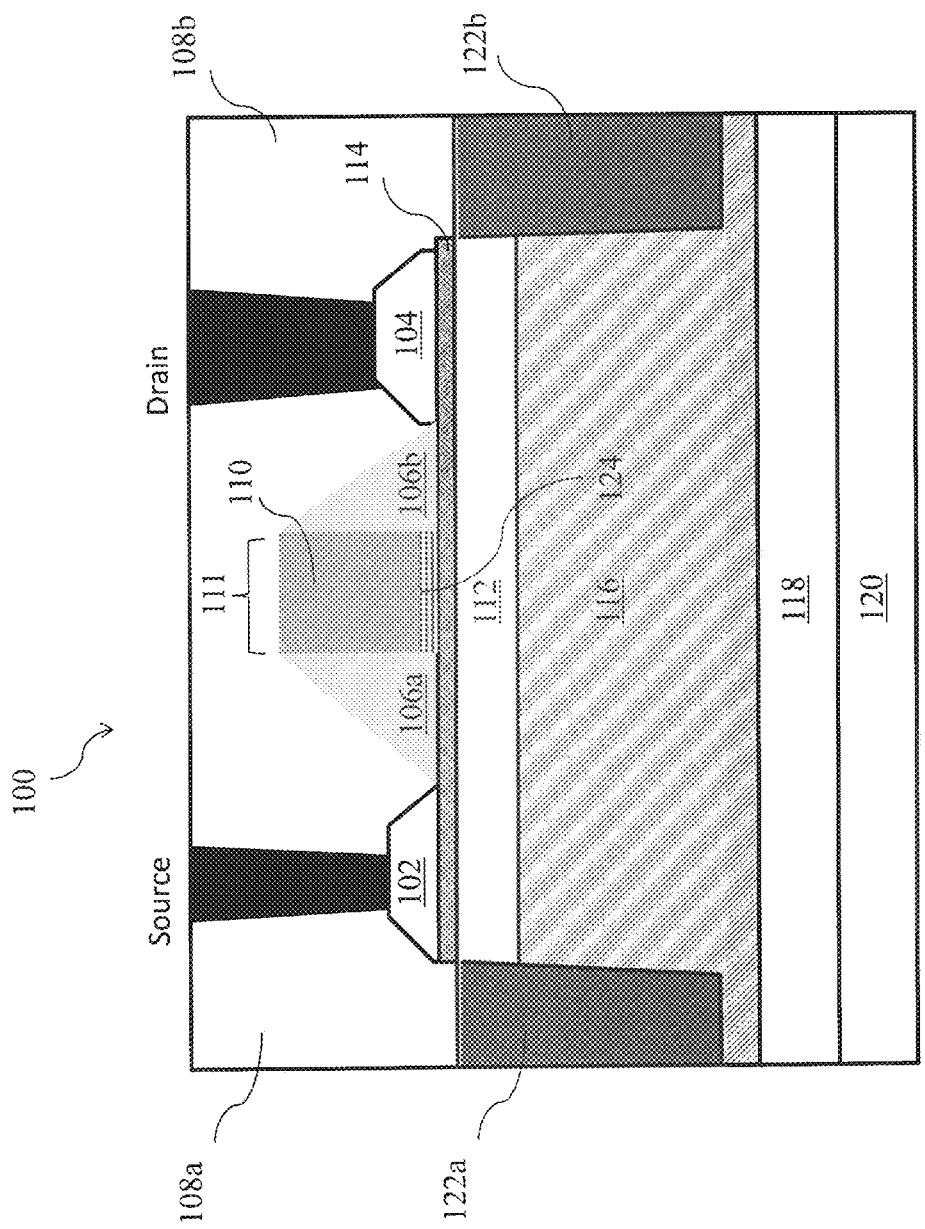
FIG. 1 (Conventional)

US 9,978,848 B2

UTBB FDSOI SPLIT GATE DEVICES

CROSS REFERENCE TO RELATED APPLICATIONS

This application claims the benefit of U.S. Provisional Application No. 62/193,953, filed Jul. 17, 2015, which is incorporated herein by reference in its entirety.

FIELD

Embodiments of the present disclosure relate generally to the physical structure of a metal oxide semiconductor (MOS), including implementing a split gate topology on an ultra-thin body and box (UTBB) fully depleted silicon on insulator (FDSOI) semiconductor device.

BACKGROUND

Advances in semiconductor technologies have resulted in dramatically increased circuit packing densities and higher speeds of operation. In order to achieve such increased densities, a wide variety of evolutionary changes have taken place with respect to semiconductor processing techniques and semiconductor device structures over the years.

As technologies evolve to produce smaller and denser circuits, the evolution has also created challenges. As an example, as semiconductor devices are made to be smaller and denser, there applicability to high voltage applications have presented a challenge with respect to the breakdown voltages of the semiconductor device. As an example, a fully depleted silicon-on-insulator (FDSOI) device formed on 28 nm nodes can offer higher performance, lower power, and low drain-to-drain voltage (Vdd) as compared to a 28 nm bulk semiconductor device. However, current FDSOI devices do not include high voltage devices with high performance such as for very high frequency power amplifier applications and power management, due to an inadequate breakdown voltage in devices made with smaller process technologies. As the operating voltages applied to the transistors increase, the transistors will eventually breakdown causing an uncontrollable increase in current. Examples of the detrimental effects of the breakdown may include punch-through, avalanche breakdown, and gate oxide breakdown.

BRIEF DESCRIPTION OF THE DRAWINGS

The present disclosure is described with reference to the accompanying drawings. In the drawings, like reference numbers indicate identical or functionally similar elements. Additionally, the left most digit(s) of a reference number identifies the drawing in which the reference number first appears.

FIG. 1 shows an example of a conventional fully depleted silicon-on-insulator (FDSOI) semiconductor device.

DETAILED DESCRIPTION

Figure 2:
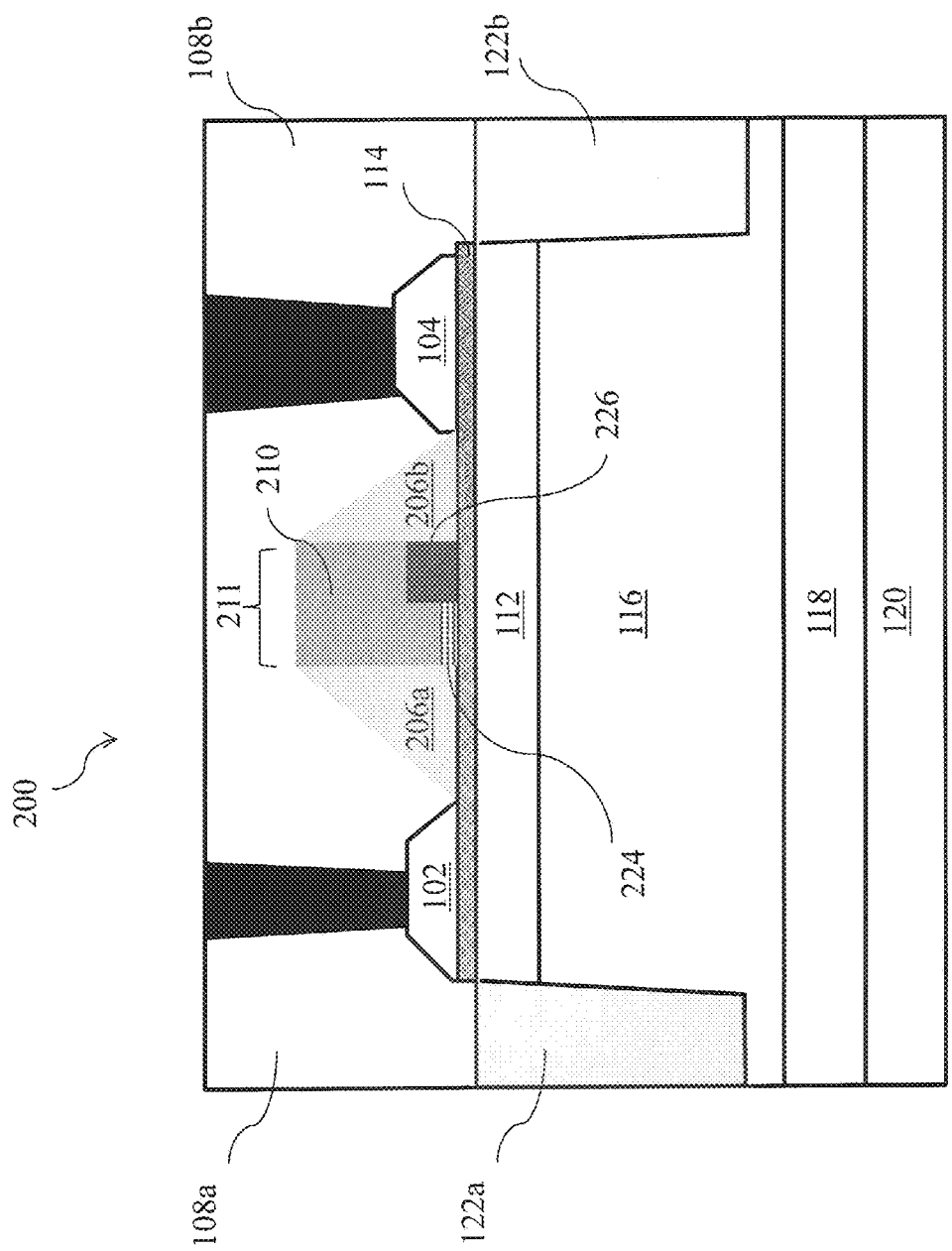
FIG. 2 illustrates an example of a fully depleted silicon-on-insulator (FDSOI) semiconductor device with a split gate topology according to aspects of the present disclosure.

The following. Detailed Description refers to accompanying drawings to illustrate exemplary embodiments consistent with the disclosure. In the following description, numerous specific details are set forth in order to provide a thorough understanding. However, it will be apparent to those skilled in the art that the disclosure, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure. The exemplary embodiments described herein are provided for illustrative purposes, and are not limiting. Other exemplary embodiments are possible, and modifications can be made to the exemplary embodiments within the spirit and scope of the disclosure. Therefore, the Detailed Description is not meant to limit the present disclosure.

FIG. 1 shows an example of a conventional fully depleted silicon-on-insulator (FDSOI) semiconductor device 100. As illustrated in FIG. 1, FDSOI device 100 can include a base silicon layer 120. A deep N-well 118 can be disposed above the base silicon layer 120, in order to reduce effects of noise coupling on the device 100. An N/P well 116 can be disposed above deep N-well 118. By reducing the effects of noise coupling on the device 100, the deep N-well 118 can act to isolate the N/P well 116. The N/P well 116 can be implemented as either an N-well or a P-well. N-wells are silicon substrates doped with n-type impurities, so as to produce more electron carriers than "hole" carriers under proper biasing conditions. Likewise, P-wells are silicon substrates doped p-type impurities, so as to produce more "hole" carriers than electron carriers under proper biasing conditions.

The N/P well 116 can be biased (i.e., have a voltage applied to it) during operation of the semiconductor device 100. By biasing the N/P well 116, the behavior of the transistor can be controlled not only through the gate but also through the N/P well in a similar manner to the body biasing available in bulk semiconductor technologies. By body biasing the device, the threshold voltage (i.e., the turn-on voltage) of the device can be manipulated. In one example, if the N/P well 116 is implemented as an N-well, then by applying a voltage to the N-well 116, the threshold voltage of the device can be lowered. In another example, if the N/P well 116 is implemented as a P-well, then by applying a voltage to the P-well 116, the threshold voltage of the device can be raised.

A buried oxide (BOX) layer 112 can be disposed above the N/P well 116. The BOX layer 112 can be an ultra-thin layer of insulator disposed between the N/P well 116 and a channel layer 114. The BOX layer 112 can have a thickness of approximately 20 nm and act to reduce parasitic capacitance between the source 102 and the drain 104. Also, the BOX layer 112 allows for the efficient confinement of the electrons that flow from the source to 102 the drain 104, thus reducing performance-degrading leakage currents. The BOX layer 112 can be implemented using $SiO_2$ or other like insulator, or oxide materials.

The channel layer 114 can be implemented using a very thin (approximately 6 nm) silicon film. Due to its thinness, the channel layer 114 can be undoped thus making the channel layer fully depleted (i.e. substantially devoid of either electron or hole carriers) when unbiased. More specifically, the thinness of the channel layer 114 can allow for more stable control of electron flow within the layer (i.e, reduced leakage currents) thus allowing for the channel layer 114 to be undoped.

A source 102 and a drain 104 are disposed adjacent to the channel layer 114 as illustrated in the figure. Both the source 102 and the drain 104 can be implemented in a raised source/drain (RSD) architecture meaning that they are formed above the channel in whole or in part. The source 102 and drain 104 can be either p or n doped depending on the type of semiconductor device. In the case of a pnp device, the source 102 and drain 104 can be p+ doped and in the case of an npn device the source and drain can be n⁻ doped. The raised/source drain regions are created using epitaxy. In some embodiments of the disclosure, the epitaxy used to grow the raised source/drain regions is a "selective" epitaxy that only grows on silicon based regions of the device that the epitaxial film is exposed to.

The source 102 and drain 104 can be doped using standard doping techniques. In the instance of FDSOI type devices, the doping of the source 102 and the drain 104 can be achieved by implant doping or by using in-situ doping. In implant doping, the dopants are introduced to the source 102 and the drain 104 after the epitaxial film used to create the raised source/drain regions has been grown. In in-situ doping, the dopants are introduced during the process of growing the epitaxial film on the raised source/drain regions.

A gate structure 111 is disposed above the channel layer 114 and in between the source 102 and the drain 104 as illustrated in the figure. The gate structure 111 can include a gate dielectric 124 and a gate metal 110 in an exemplary embodiment. The gate metal 110 can operate as an electrode to receive an external voltage that controls the conductivity of the device 100. In FIG. 1, the gate structure 111 is illustrated as being equidistant between the source 102 and the drain 104.

Spacers 106 (denoted as 106a and 106b in the figure) are deposited adjacent to the gate structure 111 as illustrated in FIG. 1 and act to provide the required spacing between the source 102 and gate structure 111, and between the gate structure 110 and the drain 104.

Deep trench isolation (TI) layers 122 (denoted as 122a and 122b in the figure) can be deposited adjacent to the stack-up of the N/P well 116, the BOX layer 112 as well as the source 102 and drain 104 as illustrated in the figure. An encapsulation dielectric layer 108 (denoted as 108a and 108b in the figure) is deposited above all of the components of the device 100 to seal the device from the environment.

FDSOI devices can offer higher performance, lower power and low drain-to-drain voltage (Vdd) as compared to a bulk semiconductor device. However, current FDSOI devices do not include high voltage devices such as LDMOS for power amplifier applications and power management due an inadequate breakdown voltage in the device.

Gate dielectric layer 124 can be disposed between channel layer 114 and gate 110. The gate dielectric layer 124 serves to separate the gate metal 110 from the underlying channel 114, and also serves as the dielectric layer so that the gate metal 110 can sustain an electrical signal high enough to modulate the conductance of the channel. The gate dielectric layer 124 may be formed using a dielectric material such as silicon dioxide ($SiO_2$), though any suitable material may be used as will be understood by those skilled in the art.

Gate dielectric layer 124 is positioned below the gate metal 110, between the source region 102 and the drain region 104. The gate dielectric layer 124 may extend from a first side positioned adjacent to and/or in contact with the spacer 106a to a second side positioned adjacent to and/or in contact with the spacer 106b.

The gate dielectric layer 124 can have an impact on the overall breakdown voltage of the device. As an example, if a high enough voltage is applied to the gate dielectric layer 124 via the gate metal 110, the gate dielectric layer 124 over time can begin to form defects. For example, a hot carrier effect may cause the defects inside the gate dielectric layer 124. The hot carrier effect refers to an effect of high energy carrier electrons and/or carrier holes generated as a result of impact ionization at the channel region. These high energy current carriers may leave the channel layer 114 and may, upon reaching a sufficiently high level of energy, tunnel into the gate oxide 124 to cause the defects. As the number of defects in the gate dielectric layer 124 increases due to a high voltage, eventually a conductive path can be formed in the gate dielectric layer 124. The conductive path can heat the gate dielectric layer 124, eventually leading to a full break down of the gate dielectric layer 124. A full break down can result in the gate dielectric layer 124 breaching, and thus forming a permanent conducive path between the source and drain of the device, thus leading to total transistor failure.

The voltage at which this breakdown occurs is proportional to the thickness of the gate dielectric layer 124. A thicker gate dielectric layer 124 can prevent defects in the gate dielectric layer from being created by an increased voltage applied to the gate.

However, a thicker gate dielectric layer can also yield potential drawbacks. As one example, the turn-on voltage of a device can be proportional to the thickness of the gate dielectric layer. In other words the trans-conductance ($g_m$) of the gate will decrease due to the thickness of the gate dielectric layer. In this way, the voltage required to create an inversion layer between the source and the drain through the channel will increase.

FIG. 2 illustrates an example of a fully depleted silicon-on-insulator (FDSOI) semiconductor device 200 with a split gate topology according to aspects of the present disclosure. The device 200 illustrated in FIG. 2 includes a modified gate structure 211 as discussed below, relative to that of FIG. 1. Common elements with FIG. 1 are not described below, as their description was provided above.

Gate structure 211 is disposed above the channel layer 114 and laterally between the source 102 and the drain 104. The gate structure 211 can include gate dielectric layer portions 224 and 226, and a gate metal 210. Device 200 illustrates a gate structure 211 that is equidistant between the source 102 and the drain 104, however, the disclosure is not as limiting and can also apply to examples in which the gate is closer to either the source 102 or drain 104 such as in an extended drain topology.

Spacers 206 (denoted as 206a and 206h in the figure) are deposited adjacent to the gate structure 211 as illustrated in FIG. 2 and act to provide the required spacing between the gate structure 211 and the source 102, and between the gate structure 201 and the drain 104.

The device 200 includes gate dielectric layer between the gate structure 211 and the underlying channel 114. However, rather than utilize one homogeneous gate dielectric layer as is illustrated in FIG. 1, the device 200 of FIG. 2 utilizes two adjacent gate dielectric layer portions 224 and 226 that have different thicknesses. These gate dielectric layer portions 224 and 226 can be referred to as first and second portions of a gate dielectric region.

Gate dielectric layer portions 224 and 226 are disposed vertically between the gate metal 210 and the channel layer 114, and can together span the horizontal length of the gate metal 210, as shown in FIG. 2. Gate dielectric layer portion 224 can be thinner than gate dielectric layer portion 226 and is disposed between the gate metal 210 and the channel layer 114 on the side of the gate structure 211 that is proximal to the source 102 as illustrated. Gate dielectric layer portion 226, which is thicker than gate dielectric layer portion 224, is disposed on the side of the gate structure 211 that is proximal to the drain 104 as illustrated. As an example, gate dielectric layer portion 224 can be 1-2 nm thick while gate dielectric layer portion 226 can be 3-7 nm thick. The gate dielectric portions 224 and 226 can be formed of a common material, such as silicon dioxide ($SO_2$). Alternatively, differing materials can be used. By employing a "split gate" (i.e., a gate dielectric layer with two portions of varying thickness) the benefits obtained by having a thinner gate dielectric layer and a thicker gate dielectric layer are realized as discussed below.

The "thin" gate dielectric layer portion 224 can allow for a higher trans-conductance (i.e., a lower turn-on voltage for the device) while the "thick" gate dielectric layer portion 226 can provide added resistance to the channel, thus giving device 200 a higher break down voltage.

The thin gate dielectric layer portion 224, positioned closest to the source 102, may extend from a first side positioned adjacent to and/or in contact with the spacer 206a to a second side positioned adjacent to and/or in contact with the thick gate dielectric layer portion 226, as shown. Thick gate dielectric layer 226 portion, positioned closest to the drain 104, may extend from a first side positioned adjacent to and/or in contact with thin gate dielectric layer portion 224 to a second side positioned adjacent to and/or in contact with the spacer 206b. In one example, the thin dielectric layer 224 portion can be 20 nm long (i.e., the distance between spacer 206a and thick gate dielectric layer portion), and the thick dielectric layer portion 226 can be 40 nm long (i.e., the distance between thin dielectric layer portion 224 and spacer 206b). The thick dielectric portion 226 can have varying lengths depending on the application and can range from 23 nm to 150 nm.

Figure 3:
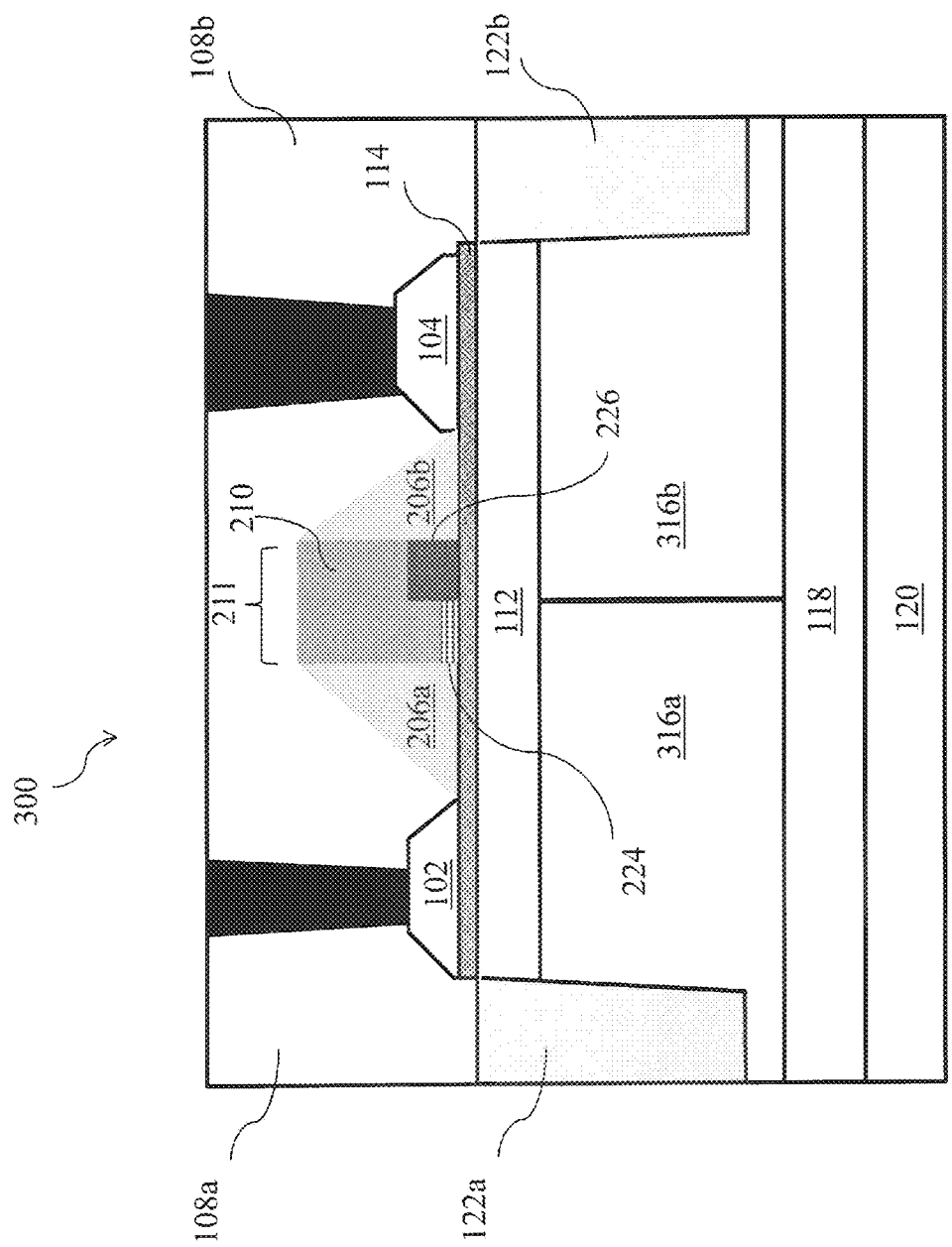
FIG. 3 shows another example of a fully depleted silicon-on-insulator (FDSOI) semiconductor device with a split gate topology according to aspects of the present disclosure.

FIG. 3 shows another example of a fully depleted silicon-on-insulator (FDSOI) semiconductor device 300 with a split gate topology according to aspects of the present disclosure. Referring back to FIG. 1, and as discussed above, N/P well 116 can be biased (i.e., have a voltage applied to it) during operation of the semiconductor device 100. By biasing the N/P well 116, the conductivity of the transistor can be controlled not only through the gate but also through the N/P well. FIG. 3 illustrates an alternative implementation of the N/P 116 well illustrated in FIG. 1.

Referring to FIG. 3, The N/P well is implemented as two separate wells 316a and 316b. In one embodiment, N/P 316a can be implemented as an N-well while N/P 316b can be implemented as a P-well. In another embodiment, N/P 316a can be implemented (e.g. doped) as a P-well while N/P 316b can be implemented (e.g. doped) as an N-well. By implementing wells 316a and 316b as complementary doping polarity wells, control over the threshold device can be more robust.

As an example, assuming N/P well 316a is implemented as an N-well and N/P well 316b is implemented as a P-well. A split well (i.e., wells 316a and 316b having opposite polarities) can lower the threshold voltage. The threshold voltage of the device can be further lowered by applying a voltage to P-well 316b, while no voltage is applied to N-well 316a. To lower the threshold voltage further, a voltage could be applied to N-well 316a.

In the embodiment where N/P well 316a is implemented as a P-well and N/P well 316b is implemented as an N-well, a split well can lower the threshold voltage. The threshold voltage of the device can be further lowered by applying a voltage to P-well 316a, while no voltage is applied to N-well 316b. To lower the threshold voltage of the device further, a voltage can applied to N-well 316b as well.

CONCLUSION

The aforementioned description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance provided herein.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The present disclosure has been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof are appropriately performed.

It is to be appreciated that the Detailed Description section, and not the Abstract section, is intended to be used to interpret the following claims. The Abstract section may set forth one or more, but not all exemplary embodiments, of the disclosure, and thus, are not intended to limit the disclosure and the appended claims in any way.

What is claimed is:

1. A semiconductor device, comprising:
a source region disposed above a substrate layer;
a drain region disposed above the substrate layer and laterally spaced apart from the source region;
a channel layer disposed above the substrate layer and disposed between the source region and the drain region;
a gate electrode disposed above the channel layer and laterally between the source region and the drain region; and
a gate dielectric region disposed between the gate electrode and the channel layer, the gate dielectric region including a first portion and a second portion, wherein a thickness of the second portion is greater than a thickness of the first portion, wherein the first portion of the gate dielectric region is disposed relatively proximally to the source region, and wherein the second portion of the gate dielectric region is disposed relatively proximally to the drain region, and wherein the first portion and the second portion of the gate dielectric region are formed from different dielectric materials.

2. The semiconductor device of claim 1, wherein the first portion of the gate dielectric region is adjacent to, and in contact with, the second portion of the gate dielectric region.

3. The semiconductor device of claim 1, wherein the channel layer is disposed above and in contact with a buried oxide (BOX) layer to form a fully depleted silicon-on-insulator (FDSOI) device.

4. The semiconductor device of claim 1, further comprising:

a spacer layer comprising a first portion and a second portion, the first portion of the spacer layer disposed between the gate dielectric region and the source region, and the second portion of the spacer layer disposed between the gate dielectric region and the drain region.

5. A semiconductor device, comprising:

a source region disposed above a substrate layer;

a drain region disposed above the substrate layer and laterally spaced apart from the source region;

a channel layer disposed above the substrate layer and disposed between the source region and the drain region;

a gate electrode disposed above the channel layer and laterally between the source region and the drain region; and a gate dielectric region disposed between the gate electrode and the channel layer, the gate dielectric region including a first portion and a second portion, wherein a thickness of the second portion is greater than a thickness of the first portion, and wherein the source region, the drain region, and the channel layer are disposed above a split well layer.

6. The semiconductor device of claim 5, wherein the split well layer includes a first portion with a first doping polarity and a second portion with a second doping polarity, wherein the first doping polarity and the second doping polarity are complementary.

7. The semiconductor device of claim 6, wherein a threshold voltage of the semiconductor device is adjusted by applying a voltage to the first portion of the split well layer relative to the second portion of the split well layer.

8. The semiconductor device of claim 5, wherein the split well layer includes a first portion that is doped N-type, and a second portion that is doped P-type, wherein a threshold voltage of the semiconductor device is adjusted by applying a voltage to the first portion of the split well layer relative to the second portion of the split well layer.

9. The semiconductor device of claim 5, wherein the first portion of the gate dielectric region is disposed relatively proximally to the source region, and wherein the second portion of the gate dielectric region is disposed relatively proximally to the drain region.

10. The semiconductor device of claim 5, wherein the first portion of the gate dielectric region is adjacent to, and in contact with, the second portion of the gate dielectric region.

11. The semiconductor device of claim 5, wherein the channel layer is disposed above and in contact with a buried oxide (BOX) layer to form a fully depleted silicon-on-insulator (FDSOI) device.

12. The semiconductor device of claim 5, further comprising:

a spacer layer comprising a first portion and a second portion, the first portion of the spacer layer disposed between the gate dielectric region and the source region, and the second portion of the spacer layer disposed between the gate dielectric region and the drain region.

13. A semiconductor device, comprising:

a source region disposed above a substrate layer;

a drain region disposed above the substrate layer and laterally spaced apart from the source region;

a channel layer disposed above the substrate layer and disposed between the source region and the drain region;

a gate electrode disposed above the channel layer and laterally between the source region and the drain region; and a gate dielectric region disposed between the gate electrode and the channel layer, the gate dielectric region including a first portion configured to have a first breakdown voltage and a second portion configured to have a second breakdown voltage, wherein the second breakdown voltage is greater than the first breakdown voltage, wherein the first portion of the gate dielectric region is disposed relatively proximally to the source region, and wherein the second portion of the gate dielectric region is disposed relatively proximally to the drain region, and wherein the first portion and the second portion of the gate dielectric region are formed from different dielectric materials.

14. The semiconductor device of claim 13, wherein the first portion of the gate dielectric region is adjacent to, and in contact with, the second portion of the gate dielectric region.

15. The semiconductor device of claim 14, wherein a thickness of the second portion is greater than a thickness of the first portion.

16. The semiconductor device of claim 15, wherein a threshold voltage of the semiconductor device is substantially determined by the thickness of the first portion.

17. The semiconductor device of claim 13, wherein the channel layer is disposed above and in contact with a buried oxide (BOX) layer to form a fully depleted silicon-on-insulator (FDSOI) device.

18. A semiconductor device, comprising:

a source region disposed above a substrate layer;

a drain region disposed above the substrate layer and laterally spaced apart from the source region;

a channel layer disposed above the substrate layer and disposed between the source region and the drain region;

a gate electrode disposed above the channel layer and laterally between the source region and the drain region; and a gate dielectric region disposed between the gate electrode and the channel layer, the gate dielectric region including a first portion configured to have a first breakdown voltage and a second portion configured to have a second breakdown voltage, wherein the second breakdown voltage is greater than the first breakdown voltage, and wherein the source region, the drain region, and the channel layer are disposed above a split well layer, wherein the split well layer includes a first portion with a first doping polarity and a second portion with a second doping polarity, wherein the first doping polarity and the second doping polarity are complementary.

19. The semiconductor device of claim 18, wherein the threshold voltage of the semiconductor device is adjusted by applying a voltage to the first portion of the split.

20. The semiconductor device of claim 18, wherein the first portion of the gate dielectric region is disposed relatively proximally to the source region, and wherein the second portion of the gate dielectric region is disposed relatively proximally to the drain region.

21. The semiconductor device of claim 18, wherein the first portion of the gate dielectric region is adjacent to, and in contact with, the second portion of the gate dielectric region.

* * * * *